(12) United States Patent
Kato et al.

(10) Patent No.: US 9,676,193 B2
(45) Date of Patent: Jun. 13, 2017

(54) SUBSTRATE PROCESSING METHOD AND METHOD OF MANUFACTURING SUBSTRATE FOR LIQUID DISCHARGE HEAD INCLUDING FORMING HOLE IN SUBSTRATE BY DRY ETCHING

(71) Applicant: CANON KABUSHIKI KAISHA, Tokyo (JP)

(72) Inventors: Masataka Kato, Hiratsuka (JP); Hiroshi Higuchi, Atsugi (JP); Yoshinao Ogata, Fukushima (JP); Seiko Minami, Warabi (JP); Masaya Uyama, Kawasaki (JP); Toshiyasu Sakai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/708,063

(22) Filed: May 8, 2015

(65) Prior Publication Data
US 2015/0328896 A1     Nov. 19, 2015

(30) Foreign Application Priority Data

May 13, 2014 (JP) .................................. 2014-099415

(51) Int. Cl.
*B41J 2/16* (2006.01)
*H01L 21/306* (2006.01)
*B41J 2/14* (2006.01)

(52) U.S. Cl.
CPC .......... *B41J 2/1645* (2013.01); *B41J 2/1404* (2013.01); *B41J 2/14145* (2013.01); *B41J 2/1603* (2013.01); *B41J 2/1626* (2013.01); *B41J 2/1628* (2013.01); *B41J 2/1631* (2013.01); *H01L 21/306* (2013.01)

(58) Field of Classification Search
CPC ... H01L 2924/00; H01L 21/00; H01L 33/005; H01L 2224/11
See application file for complete search history.

(56) References Cited

U.S. PATENT DOCUMENTS 5,320,981 A * 6/1994 Blalock ............. H01L 21/76804
                                                   257/E21.578
7,837,887 B2   11/2010 McReynolds
(Continued)

OTHER PUBLICATIONS

Evans, Laura J. and Beheim, Glenn M., Deep Reactive Ion Etching (DRIE) of High Aspect Ratio SiC Microstructures using a Time-Multiplexed Etch-Passivate Process, Oct. 2006, Materials Science Forum, vols. 527-529, pp. 1115-1118.*

*Primary Examiner* — Marc Armand
*Assistant Examiner* — Shannon Yi
(74) *Attorney, Agent, or Firm* — Canon U.S.A., Inc. IP Division (57) ABSTRACT

A substrate processing method includes forming a first hole in a first surface of a silicon substrate to have a depth that it does not extend through the substrate and forming a second hole in a second surface to make the second hole to communicate with the first hole, so that a through hole formed of the first and second holes is formed in the substrate. The process of forming the second hole includes forming a communication portion wider than an opening of the first hole between the first and second holes after the second hole has been made to communicate with the first hole by dry etching.

10 Claims, 7 Drawing Sheets

(56) References Cited

U.S. PATENT DOCUMENTS

| | | | |
|---|---|---|---|
| 2006/0201908 A1* | 9/2006 | Okazawa | B41J 2/14274 216/27 |
| 2010/0253743 A1* | 10/2010 | Takeuchi | B41J 2/162 347/47 |
| 2012/0028383 A1* | 2/2012 | Hiramoto et al. | 438/21 |
| 2014/0291285 A1* | 10/2014 | Zhang | B41J 2/1629 216/27 |

* cited by examiner

SUBSTRATE PROCESSING METHOD AND METHOD OF MANUFACTURING SUBSTRATE FOR LIQUID DISCHARGE HEAD INCLUDING FORMING HOLE IN SUBSTRATE BY DRY ETCHING

BACKGROUND

Field of the Invention

Disclosed herein is a substrate processing method for forming a through hole in a silicon substrate. In particular, the present disclosure relates to a method of manufacturing a substrate for a liquid discharge head, the method including forming a liquid supply port in a silicon substrate that is to be used as a substrate of a liquid discharge head that discharges liquid.

Description of the Related Art

A method using reactive ion etching (hereinafter referred to as RIE), which is a type of dry etching, is a known example of a substrate processing method for forming a through hole in a silicon substrate. Unlike wet etching, RIE uses an etching gas, and thus, RIE is suitable for forming a through hole perpendicular to a surface of a silicon substrate. Therefore, in the case of forming, in a substrate of a liquid discharge head, a representative example of which is an ink jet head, a through hole perpendicular to a surface of the substrate as a liquid supply port, RIE may be used. A method disclosed in U.S. Pat. No. 7,837,887 (see FIGS. 6 to 7) (hereinafter referred to as U.S. Pat. No. 7,837,887) is an example of a method for forming a liquid supply port in a substrate for an ink jet head by using RIE.

According to U.S. Pat. No. 7,837,887, a liquid supply port is formed in a substrate for an ink jet head through the following Steps 1 to 8. First, a silicon substrate having two opposing surfaces (first and second surfaces) is prepared (Step 1). Next, a plurality of first holes are formed in the first surface of the silicon substrate by performing an etching operation (Step 2). The first holes are filled with a photoresist (Step 3). After that, a flow-path-structure portion that includes a liquid discharge port and a liquid flow path is formed on the first surface (Step 4). Then, a second hole is formed in the second surface of the silicon substrate by performing an etching operation in such a manner that the second hole reaches the photoresist in the first holes (Step 5). In addition, oxygen plasma etching is performed on the second surface in such a manner as to remove part of the photoresist in the first holes via the second hole, so that end portions of side walls of the first holes, the end portions being continuous with the second hole are exposed (Step 6). Next, the shapes of the exposed end portions of the side walls of the first holes are corrected (Step 7). Finally, the photoresist with which the first holes have been filled is removed (Step 8), and the liquid supply port is completed.

In the above-described Steps 2 and 5, the holes are formed in the substrate by performing dry etching called RIE. In the dry etching, a reaction gas is introduced into a processing chamber and transformed into plasma, and one of the surfaces of the substrate, which is to be processed, is etched by using the reaction gas, which has been transformed into plasma, so that a hole having a predetermined shape is formed in the surface to be processed. More specifically, an upper electrode and a lower electrode that are connected to each other via a high-frequency power source are disposed so as to face each other in the processing chamber, and in a state where the substrate is fixed to the lower electrode by, for example, an electrostatic chuck, the reaction gas is supplied to a space between the lower electrode and the upper electrode from micropores formed in the upper electrode. The reaction gas is transformed into plasma between the upper electrode and the lower electrode, and the reaction gas, which has been transformed into plasma, etches the substrate.

U.S. Pat. No. 7,837,887 discloses a method for forming a liquid supply port by forming first holes, each of the first holes having such a depth that it does not extend through a substrate, in a first surface of the substrate first, and after that, forming a second hole in a second surface of the substrate on the opposite side to the first surface in such a manner that the second hole is in communication with the first holes. In addition, regarding the formation of the second hole, U.S. Pat. No. 7,837,887 discloses that, in the case where the second hole is formed in such a manner that the entirety or portions of open ends of the first holes are present within the second hole, unetched portions are formed in opening edge portions of the first holes, the opening edge portions being continuous with the second hole, and this results in formation of burrs called crowns.

The mechanism of occurrence of crowns will now be described with reference to FIGS. 6A to 6F.

Figure 6A:
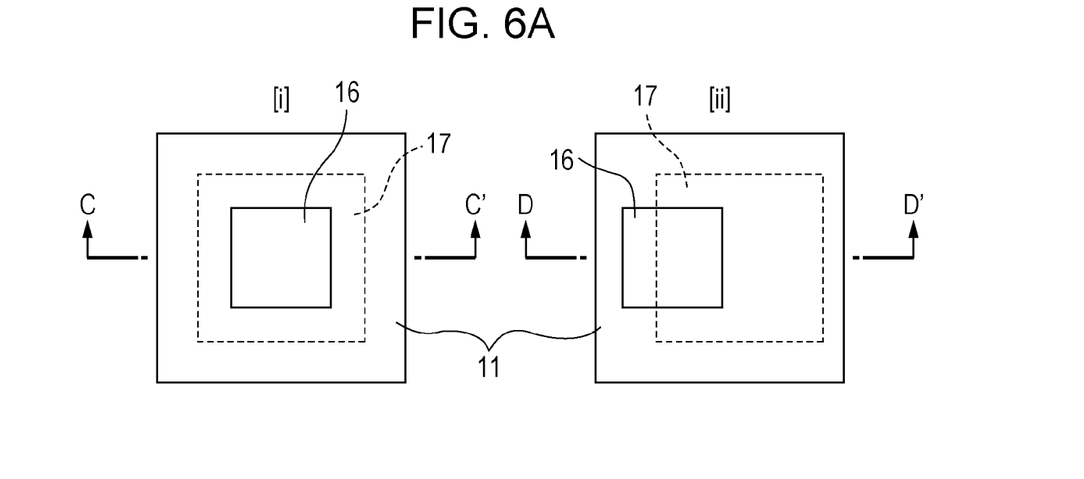
FIGS. 6A to 6F are diagrams illustrating the principle of formation of a crown when a liquid supply port is formed.

FIG. 6A is a plan view illustrating a portion of a first surface 11a of a substrate 11 and illustrates two cases [i] and [ii] where the position of a first hole 16 with respect to a second hole 17 is different. In the case [i], a liquid supply port has a shape in which the entirety of an opening end of the first hole 16 is present within the second hole 17. In the case [ii], the liquid supply port has a shape in which a portion of the opening end of the first hole 16 is present within the second hole 17. A process of manufacturing the liquid supply port in each of the cases [i] and [ii] is illustrated on a time-series basis in FIGS. 6B to 6F by using a sectional view taken along line C-C' of FIG. 6A and a sectional view taken along line D-D' of FIG. 6A. In particular, FIG. 6B illustrates a state immediately before the first hole 16 and the second hole 17 are made to communicate with each other, and FIGS. 6C to 6E are enlarged views of a portion VIC TO VIE (the inside of a one dot chain line frame) in FIG. 6B.

Figure 6B:
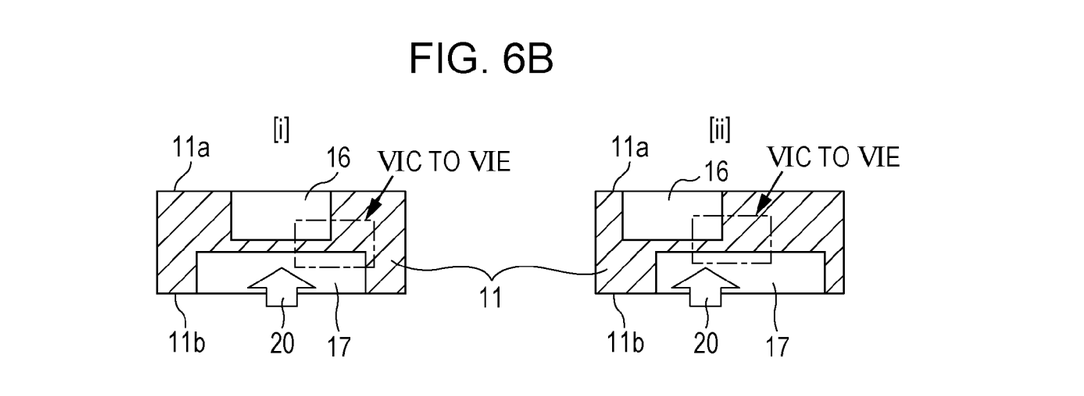
Figure 6C:
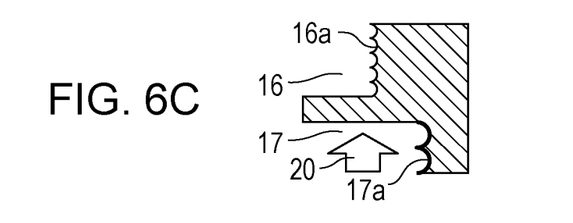
Figure 6D:
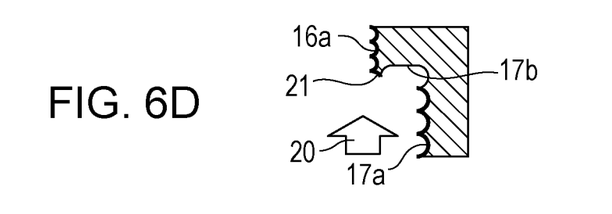
Figure 6E:
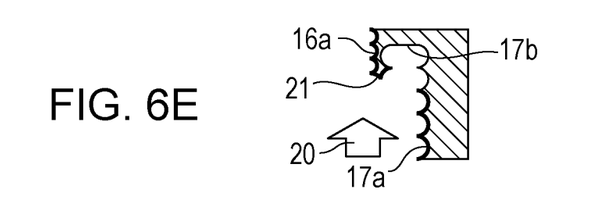
Figure 6F:
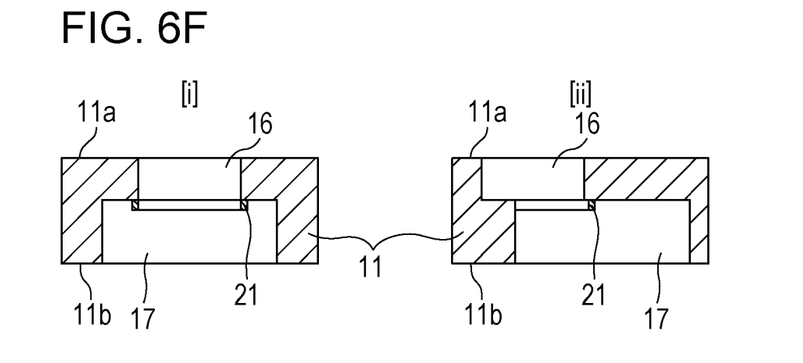

In the case where the liquid supply port in each of the cases [i] and [ii] illustrated in FIG. 6A is formed, as illustrated in FIGS. 6B and 6C, there is a case where the first hole 16 is formed in the first surface 11a of the substrate 11 first, and after that, dry etching is performed on a second surface 11b of the substrate 11 in the direction of arrow 20 (hereinafter sometimes referred to as etching direction 20) in such a manner as to form the second hole 17 and make the second hole 17 to communicate with the first hole 16. In this case, in order to form the second hole 17 perpendicularly to the second surface 11b of the substrate 11, an etching method and in which a step of etching a substrate and a step of protecting a side surface of a hole formed by the etching are repeated, the method being so-called a Bosch process, is used. In other words, etching is performed several times, and before each etching, a process of forming protective films on the inner side surfaces of the holes 16 and 17 by using a coating gas is performed. It is known that, in the case where the Bosch process is performed, as illustrated in FIGS. 6C to 6E, surfaces of side walls 16a and 17a of the holes 16 and 17 are each formed in a shape having projections and depressions, the shape being called a scalloped shape. Note that bold lines in FIGS. 6C to 6E indicate the protective films.

When the second hole 17 is formed by the etching using the Bosch process, which has been described above, the protective film on a bottom portion 17b of the second hole 17, which is present in the etching direction 20, is etched, and then the bottom portion 17b is etched. In this case, the side wall 17a of the second hole 17 is a surface oriented in a direction perpendicular to the etching direction 20 and is covered with the protective film, so that it is not likely that the side wall 17a will be etched. As a result, the second hole 17 is formed while its opening dimension is maintained. After the second hole 17 has reached the first hole 16, as illustrated in FIGS. 6D and 6E, the etching operation for forming the second hole 17 is performed for some period of time in order to make the holes 16 and 17 to communicate with each other with certainty. Since the coating gas is introduced into the second hole 17 before the etching operation is performed, the protective film is formed not only on the side wall 17a of the second hole 17 but also on the side wall 16a of the first hole 16 that is in communication with the second hole 17. In this state, when the etching operation is performed in the direction of arrow 20, the protective film on the bottom portion 17b of the second hole 17, which is present in the etching direction 20, is etched, and then, the bottom portion 17b is etched. However, the side wall 16a of the first hole 16, which is present in a direction perpendicular to the etching direction 20, is etched to only a small extent. As a result, an unetched portion is formed in an edge portion of the side wall 16a of the first hole 16, the edge portion being continuous with the second hole 17, and a burr such as that illustrated in FIG. 6E, which will be referred to as a crown 21, is formed.

Note that, although such a crown is notably formed in the Bosch process, in which a side wall of an etching hole is protected before an etching operation is performed as described above, the formation of such a crown is not limited to the Bosch process. In other words, even in the case where a by-product, which is produced during the period when an etching operation is performed so as to form a hole, is attached to a side wall of the hole in such a manner as to function as a protective film, there is a possibility that a crown will be formed as in the above-described case where a side surface of a hole is protected.

In the case where a burr called a crown is formed within a liquid supply port as described above, the burr causes the following problems as described in U.S. Pat. No. 7,837,887. That is to say, the probability of the burr becoming an obstacle to the flow of liquid within the liquid supply port and affecting discharge characteristics increases. In addition, if the burr comes off and becomes mixed into the liquid as a foreign object, it becomes difficult to efficiently maintain the quality of an image printed by an ink jet head.

In order to solve these problems, in U.S. Pat. No. 7,837,887, it has been proposed to perform Steps 6 and 7, which are described above, that is, to process a burr formed within a liquid supply port.

However, in this proposal, when Steps 6 and 7 are performed, a process of protecting the interior of the liquid supply port excluding the burr with a resist or the like is required, and the overall process becomes complex, which in turn leads to an increase in the manufacturing costs of an ink jet head.

SUMMARY

Accordingly, the present disclosure provides a substrate processing method capable of forming a liquid supply port while suppressing formation of a burr and forming a liquid supply port through a simpler process.

An aspect disclosed herein relates to a substrate processing method. The substrate processing method according to the aspect includes preparing a silicon substrate having a first surface and a second surface, which is on the opposite side to the first surface, forming a first hole in the first surface in such a manner that the first hole has such a depth that it does not extend through the silicon substrate, and forming a second hole in the second surface in such a manner as to make the second hole to communicate with the first hole, so that a through hole, which is formed of the first hole and the second hole, is formed in the silicon substrate. The substrate processing method relates to a method of forming the through hole has a shape in which at least a portion of an opening end of the first hole is present within the second hole when the second surface is viewed in plan.

In the above-described aspect, the process of forming the second hole includes forming a communication portion, which is wider than an opening of the first hole, between the first hole and the second hole after the second hole has been made to communicate with the first hole by performing dry etching.

According to the method, by forming a communication portion, which is wider than an opening of the first hole, between the first hole and the second hole after the second hole has been made to communicate with the first hole by performing dry etching, edge portion of a side wall of the first hole that is continuous with the second hole is scraped off, and a burr called a crown will not be formed. Thus, the flow of liquid will not be obstructed, and such a burr will not come off as a foreign object. In addition, since the edge portion of the side wall of the first hole in which a burr is to be formed is scraped off during the period when the dry etching is performed for forming the above-described communication portion, the overall process is simple compared with the related art.

Another aspect disclosed herein is a method of applying a method of forming a through hole to formation of a liquid supply port to be formed in a substrate for a liquid discharge head.

Further features of the present invention will become apparent from the following description of exemplary embodiments with reference to the attached drawings.

DESCRIPTION OF THE EMBODIMENTS

Figure 1A:
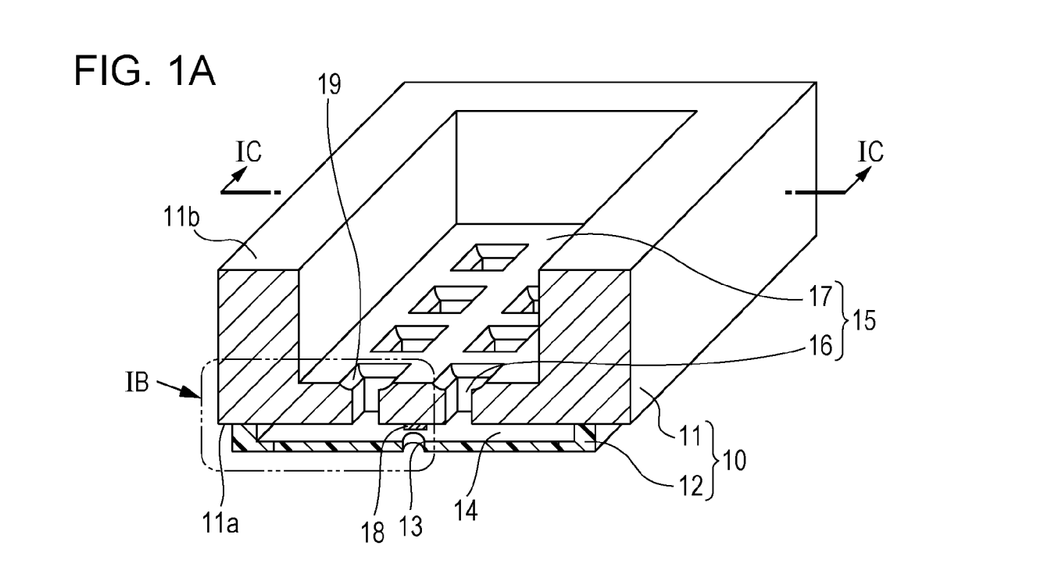
FIG. 1A is a perspective view illustrating a liquid discharge head.

The present disclosure will be described below with reference to the drawings. FIG. 1A is a perspective view illustrating a configuration example of a liquid discharge head according to the present invention.

Referring to FIG. 1A, a liquid discharge head 10 includes a substrate 11 and an orifice plate 12. The orifice plate 12

(also referred to as a discharge-port-forming member) is formed on a first surface 11a of the substrate 11 and made of a resin, a metal, or the like. In the orifice plate 12, a plurality of discharge ports 13 each of which discharges liquid, such as ink, are formed in a line, and a plurality of flow paths 14 each of which is in communication with a corresponding one of the discharge ports 13 are formed. For example, a silicon substrate is used as the substrate 11.

A liquid supply port 15 that collectively supplies the liquid to the plurality of flow paths 14 is formed in the substrate 11. The liquid supply port 15 is a through hole formed of a plurality of first holes 16 and a second hole 17 that are continuous with one another. Although a method for forming the liquid supply port 15 will be described later, the first holes 16 are formed by forming first grooves in the first surface 11a of the substrate 11 in a direction toward a second surface 11b, which is on the opposite side to the first surface 11a. On the other hand, the second hole 17 is formed by forming a second groove in the second surface 11b of the substrate 11 in a direction toward the first surface 11a. The interiors of the first grooves and the interior of the second groove communicate with one another, so that the liquid supply port 15 is formed. Each of the plurality of first holes 16 extends through a bottom portion 17a of the second hole 17. In addition, a pair of the first holes 16 are arranged in a horizontal row for each of the flow paths 14.

As units that generate energy used for discharging liquid, such as ink, electrothermal transducers that generate thermal energy, which causes film boiling of the liquid to occur in response to energization, are disposed on the first surface 11a of the substrate 11. Heat generation portions (hereinafter referred to as heaters) 18, which are upper portions of the electrothermal transducers, each face a corresponding one of the flow paths 14 and cause the thermal energy to act on the liquid. The heaters 18 are disposed in such a manner as to face the discharge ports 13, and the liquid on the heaters 18 is caused to foam by the thermal energy, so that the liquid is discharged from the discharge ports 13. Piezoelectric elements may be used instead of the electrothermal transducers.

Figure 1B:
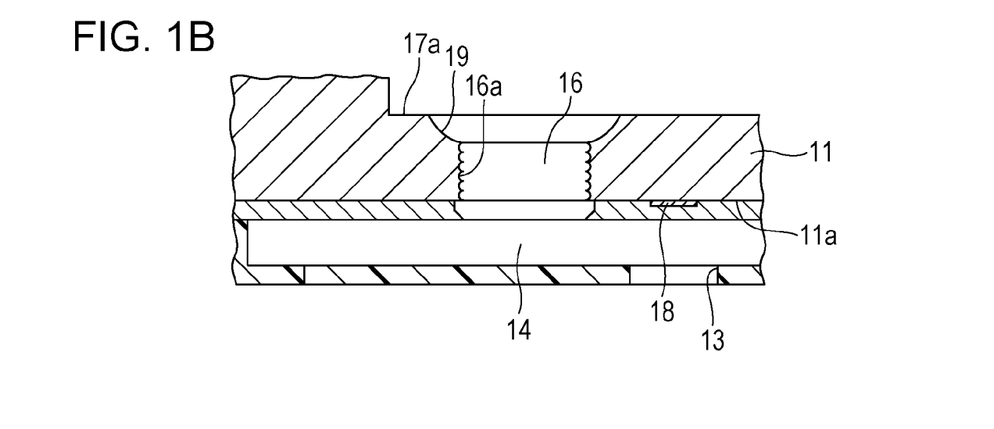
FIG. 1B is an enlarged cross-sectional view illustrating a portion IB surrounded by a two-dot chain line in FIG. 1A.
Figure 1C:
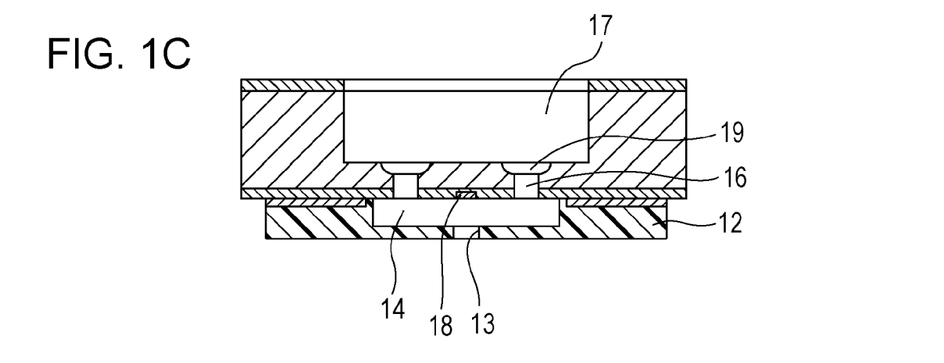
FIG. 1C is a schematic cross-sectional view taken along line IC-IC of FIG. 1A.

In the configuration of the liquid discharge head illustrated in FIGS. 1A to 1C, each of the heaters 18 is disposed in a corresponding one of the flow paths 14, which include the discharge ports 13, and each of the first holes 16, which are parts of the liquid supply port 15, is connected to one of the left and right end portions of the corresponding flow path 14. Each of the heaters 18 is positioned between the left and right end portions of the corresponding flow path 14. In this configuration, when the liquid is discharged from the discharge ports 13, each of the flow paths 14 is refilled with the liquid from a corresponding two of the first holes 16. In addition, in this configuration, liquid discharge forces in the flow paths 14 do not affect one another.

FIG. 1B is an enlarged cross-sectional view illustrating a portion IB surrounded by a two-dot chain line in FIG. 1A. FIG. 1C is a schematic cross-sectional view taken along line IC-IC of FIG. 1A. As illustrated in FIGS. 1B and 1C, in the liquid supply port 15, edge portions of side walls 16a of the first holes 16 that are continuous with the second hole 17 are scraped off, and communication portions (see opening-widened portions 19) each of which is wider than the opening of a corresponding one of the first holes 16 are formed between the first holes 16 and the second hole 17. In other words, the crown 21 (see FIGS. 6D to 6F), which has been described as one of the problems in the related art, is not formed in the edge portions of the side walls 16a of the first holes 16, which are continuous with the second hole 17, and instead of the crown 21, the opening-widened portions 19 are formed. Since there is no obstacle, such as a burr, to the flow of the liquid within the liquid supply port 15 according to the present invention, the probability that discharge characteristics will be affected can be reduced. In addition, a problem of a detached burr becoming mixed with the liquid and consequently being discharged from the discharge ports 13 will not occur. When the liquid supply port 15 illustrated in FIG. 6A, which has the shape in which the entirety of the opening end of the first hole 16 is present within the second hole 17, is formed, in the case where the second hole 17 is formed first, then the first hole 16 is formed by performing an etching operation, and the second hole 17 and the first hole 16 are made to communicate with each other, the above-described crown 21 will not be formed. Therefore, the present invention provides a technology that is useful in the case where processes such as those illustrated in FIGS. 6C to 6E, in which the crown 21 will be formed, need to be performed.

Figure 2A:
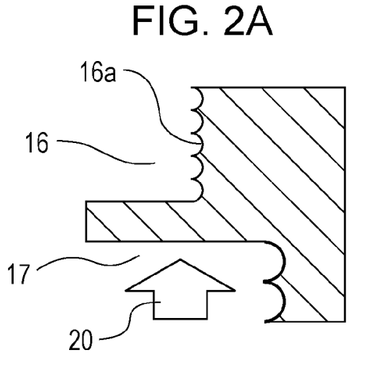
FIGS. 2A to 2E are diagrams illustrating the principle for eliminating a crown.
Figure 2B:
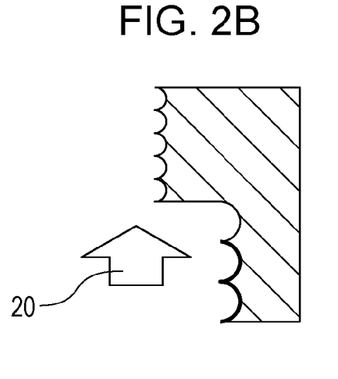
Figure 2C:
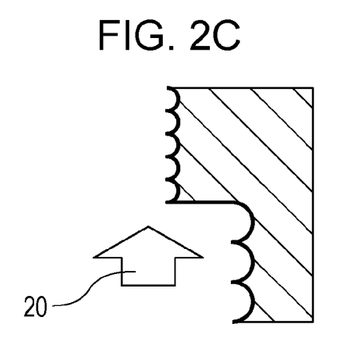

As a method for addressing the case where the crown 21 is formed as described above, a process of manufacturing a liquid supply port using the substrate processing method according to the present invention is illustrated in FIGS. 2A to 2C.

Figure 2D:
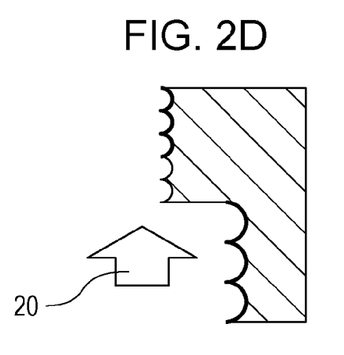
Figure 2E:
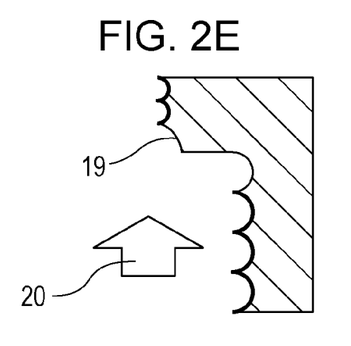

In a step illustrated in FIG. 2A, an etching operation for forming the second hole 17 is performed by repeating dry etching in the direction of arrow 20 and formation of a protective film on a side wall of an etching hole. After that, as illustrated in FIG. 2B, the second hole 17 reaches one of the first holes 16 as a result of performing the etching operation. After the second hole 17 has reached the first hole 16, the etching operation for forming the second hole 17 is performed for some period of time in order to ensure that the holes 16 and 17 are in communication with each other. A coating gas is introduced into the second hole 17 before the etching operation is performed. In this case, since the first hole 16 and the second hole 17 are in communication with each other, as illustrated in FIG. 2C, the protective film is formed not only on the side wall 17a and the bottom portion 17b of the second hole 17 but also on the side wall 16a of the first hole 16. In the present invention, when the second hole 17 is made to communicate with the first hole 16 as described above, the conditions under which the etching operation for forming the second hole 17 is performed (hereinafter referred to as etching conditions for the second hole 17) are changed to etching conditions under which not only the protective film on the bottom portion 17b of the second hole 17 but also the protective film covering an end portion of the side wall 16a of the first hole 16, the end portion being continuous with the bottom portion 17b, can be removed. By performing the etching operation in the direction of arrow 20 under the changed etching conditions, as illustrated in FIG. 2D, the protective film covering the end portion of the side wall 16a of the first hole 16, the end portion being continuous with the bottom portion 17b of the second hole 17, is removed. Then, when the bottom portion 17b of the second hole 17 is etched in the state illustrated in FIG. 2D, as illustrated in FIG. 2E, a communication portion (see the opening-widened portion 19) that is wider than the opening of the first hole 16 is formed between the first hole 16 and the second hole 17. Note that bold lines in FIGS. 2A to 2E indicate the protective films.

As described above, in the present invention, when the second hole 17 is made to communicate with the first hole 16, the etching conditions for the second hole 17 are changed to the etching conditions under which the protective film on the side wall 16a of the first hole 16 can also be removed, so that the edge portion of the side wall 16a of the first hole 16, which is continuous with the second hole 17, is scraped off by the etching, and the opening-widened portion 19 can be formed in a portion of the first hole 16 that is in communication with the second hole 17. In other words, the crown 21 illustrated in FIG. 6E can be eliminated. Note that the term "when the second hole 17 is made to communicate with the first hole 16" described herein refers to the state immediately before the second hole 17 is made to communicate with the first hole 16 or the state after the second hole 17 has been made to communicate with the first hole 16.

Specific etching conditions that are to be changed as described above in the case of the Bosch process and specific etching conditions that are to be changed as described above in the case of a non-Bosch process will now be described separately. Note that the "Bosch process" is a method of performing an etching operation by repeating a step of etching a substrate and a step of protecting (coating) a side surface of a hole formed by the etching. The "non-Bosch process" is a method of performing a step of etching and a step of protecting (coating) a side surface of an etching hole simultaneously.

Bosch Process

In the Bosch process, for example, $SF_6$ gas can be used as a gas used in an etching step, and, for example, $C_4F_8$ gas can be used as a coating gas. In the present invention, holes may be formed by performing dry etching by using an inductively coupled plasma (ICP) apparatus, or a dry etching apparatus that includes a plasma source employing a different system may be used. For example, an electron cyclotron resonance (ECR) apparatus or a magnetic neutral loop discharge (NLD) plasma apparatus can be used.

As etching conditions that are employed until immediately before the second hole 17 is made to communicate with the first hole 16, the etching step and the coating step are performed while controlling the pressures of the gases within a range of 0.1 Pa to 50 Pa and the flow rates of the gases within a range of 50 sccm to 1,000 sccm. In addition, the length of time for performing the etching step is controlled within a range of 5 seconds to 20 seconds, and the length of time for performing the coating step is controlled within a range of 1 second to 10 seconds. An etching operation can be performed with high verticality by controlling these conditions within the above ranges. Although the second hole 17 can be formed by using any one of a laser processing technique, an anisotropic wet etching technique, and dry etching, dry etching may be used from the standpoint of processing precision. Note that a gas flow rate of 1 sccm is $1.68875 \times 10^{-3}$ Pa m$^3$/s.

After that, when the second hole 17 is made to communicate with the first hole 16, a step of removing not only the protective film on the bottom portion 17b of the second hole 17 but also the protective film covering the end portion of the side wall 16a of the first hole 16, the end portion being continuous with the bottom portion 17b, is introduced into the etching step (see FIG. 2D). Examples of specific parameters include adjustment of the length of time for performing an etching operation (etching time) and adjustment of a platen power. For example, the etching time is set to be 10% longer than that under the etching conditions under which the above-described etching with high verticality is performed, and the platen power that is set within a range of 50 W to 200 W is applied during the etching time. By applying the platen power, ions can be attracted to the substrate 11, which is an object to be etched, and thus, the protective film covering the side wall 16a of the first hole 16 can be effectively removed as described above. As a result, the shape (see the opening-widened portions 19 illustrated in FIGS. 1A to 1C and FIGS. 2A to 2E) of the opening of the first hole 16 that is widened is formed in a portion in which the first hole 16 and the second hole 17 communicate with each other. However, in the present invention, a desired etching operation can also be performed by controlling not only the length of time for performing the etching step and the platen power but also the gas pressure, the gas flow rate, a coil power, and the like. In addition, the opening-widened portions 19 can be formed by reducing the thicknesses of the protective films on the side walls 16a and 17a of the holes 16 and 17 by changing the conditions under which the coating step illustrated in FIG. 2C is performed. Note that the term "platen power" as used herein refers to a high-frequency power that is to be applied between an upper electrode and a lower electrode that are disposed so as to face each other in an etching processing chamber and connected to each other via a high-frequency power source.

Non-Bosch Process

Specific etching conditions that are to be changed when the second hole 17 is made to communicate with the first hole 16 in the case of the non-Bosch process will now be described.

In the non-Bosch process, $SF_6$ gas and $O_2$ gas can be used. In the non-Bosch process, an etching operation and a coating operation are not alternately repeated, and an etching operation is performed while a by-product, which is produced during the period when the etching operation is performed, is caused to be attached to a side wall of an etching hole. Thus, the non-Bosch process enables a substantially vertical etching operation, although the verticality is lower than that of an etching operation using the Bosch process. The etching operation can be performed by controlling the gas pressure within a range of 0.1 Pa to 50 Pa and the gas flow rate within a range of 50 sccm to 1,000 sccm.

After that, immediately before the second hole 17 is made to communicate with the first hole 16, the etching conditions are changed to conditions under which an etching force in a direction toward the side walls 16a and 17a of the holes 16 and 17 increases. More specifically, the gas pressure of up to 50 Pa is changed to a low vacuum of 5 Pa or less, so that the gas that contributes to the etching operation is caused to be scattered in such a manner that the etching force in the direction toward the side walls 16a and 17a of the holes 16 and 17 increases. As a result, an etching force acting on the side wall 16a of the first hole 16 and an etching force acting on the side wall 17a of the second hole 17 act on the edge portion of the side wall 16a of the first hole 16, which is continuous with the bottom portion 17b of the second hole 17, and formation of the crown 21 can be suppressed. However, the present invention can also be practiced by changing not only the gas pressure but also conditions of the gas flow rate, the coil power, the platen power.

In the above-described Bosch process and non-Bosch process, the reason for changing the etching conditions when the second hole 17 is made to communicate with the first hole 16 in a process of forming the second hole 17, is that it is very likely that the shape of the opening of the second hole 17 will be deformed if the etching conditions for forming the second hole 17 are set to etching conditions such as those under which the opening-widened portions 19 are formed from the beginning of the etching operation. Thus, it is desirable that the etching conditions be changed to conditions such as those under which the opening-widened portions 19 are formed in the middle of formation of the second hole 17.

Embodiments
First Embodiment

A method of manufacturing a liquid discharge head according to a first embodiment of the present invention will be described below. FIGS. 3A to 3G illustrate a process of manufacturing the liquid discharge head.

Figure 3A:
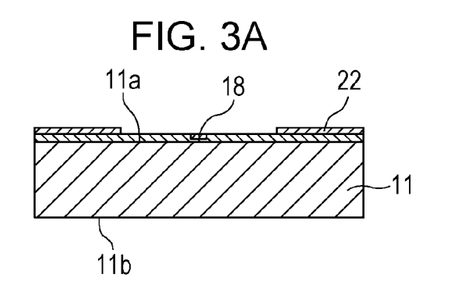
FIGS. 3A to 3G are schematic process diagrams illustrating the first embodiment.

First, as illustrated in FIG. 3A, a substrate 11 for a liquid discharge head 10, the substrate 11 including a heater 18, which includes a liquid-discharge-energy-generating element, and a wiring line (not illustrated), which is used for driving the heater 18, formed on the substrate 11, is prepared. The substrate 11 is a silicon single-crystal substrate made of an ingot having a crystal orientation of <100>. The heater 18 and the wiring line are formed on one surface (first surface 11a) of the silicon substrate, and after that, HIMAL (manufactured by Hitachi Chemical Company, Ltd.) that serves as an intermediate layer 22 is patterned through a photolithography process. The intermediate layer 22 is disposed between the substrate 11 and an orifice plate 12 in the liquid discharge head 10 in such a manner as to improve the degree of contact between the substrate 11 and the orifice plate 12.

Figure 3B:
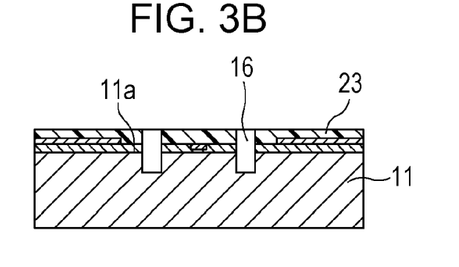

Next, as illustrated in FIG. 3B, an etching mask 23 is patterned on the side on which the first surface 11a of the substrate 11 is present, and first holes 16 are formed by performing dry etching. The etching mask 23 is formed so as to have a film thickness of 10 μm by using a novolac-based positive-type resist and is patterned by photolithography.

Although the depth of each of the first holes 16 may be such a depth that it does not extend through the substrate 11, each of the first holes 16 are formed in such a manner as to have a depth of 200 μm in order to accommodate a designed discharging performance of an ink jet head.

Figure 3C:
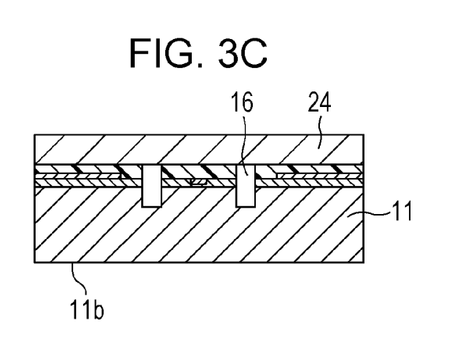

As illustrated in FIG. 3C, an etching stop layer 24 is formed on the side on which the first surface 11a is present. The etching stop layer 24 is formed in order to prevent the shapes of the first holes 16 from being deformed when an etching operation for forming the second hole 17 is performed in a subsequent process. In addition, in this process, it is necessary to form the etching stop layer 24 in a state where the first holes 16 have been formed. Accordingly, spin-film deposition using a liquid material cannot be performed when the etching stop layer 24 is formed. Therefore, a tape that is usually used as a dicing tape or a back grinding tape in a semiconductor process is used as the material out of which the etching stop layer 24 is made. As such a tape material, a material that has a good tenting property with respect to the first holes 16, that can be used as a stop layer in a dry etching operation, and that can be peeled off after performing the etching needs to be selected. In the present embodiment, ICROS TAPE (manufactured by Mitsui Chemicals, Inc.) is used.

Figure 3D:
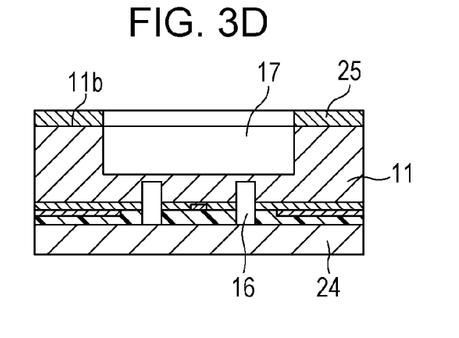

Next, as illustrated in FIG. 3D, an etching mask 25 is patterned on the side on which the second surface 11b is present, and the second hole 17 is formed so as to be in a state immediately before the second hole 17 is made to communicate with the first holes 16 by using the Bosch process. The etching conditions in this case are as follows: $SF_6$ gas is used in the etching step, $C_4F_8$ gas is used in the coating step, the gas pressure is 10 Pa, and the gas flow rate is 500 sccm. The length of time for performing the etching step (etching time) is set to 10 seconds, and the length of time for performing a coating step (coating time) is set to 5 seconds. A platen power of 100 W is applied for 5 seconds of the etching time.

Figure 3E:
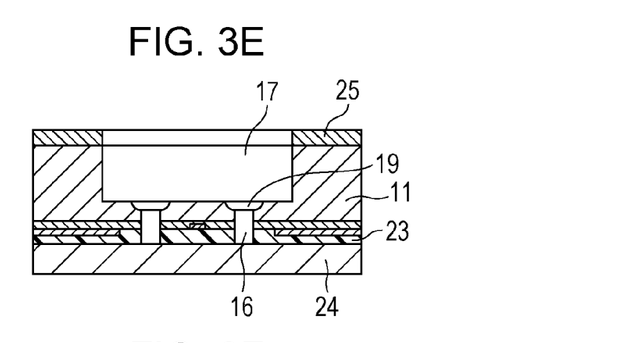

After that, the second hole 17 is formed by changing the etching conditions when the second hole 17 is made to communicate with the first holes 16, so that edge portions of the side walls 16a of the first holes 16, which are continuous with the second hole 17, are scraped off, and the above-described communication portions (see the opening-widened portions 19), each of which is wider than the opening of the corresponding first hole 16, are formed between the first holes 16 and the second hole 17 (FIG. 3E). Regarding the etching conditions in this case, the types of gases, the gas pressure, the gas flow rate, and the coating time are not changed, and the length of time for performing the etching step is set to 20 seconds, and the platen power that is set to 150 W is applied for 10 seconds of the 20 seconds. Accordingly, as described above, in the Bosch process, the etching amount with respect to protective films formed through the coating step increases, and as a result, the opening-widened portions 19 are formed. Note that the above-mentioned etching conditions before being changed and the above-mentioned etching conditions after being changed may be set after selecting the correlation between the etching time and the etching depth through experimental productions, experiments, and the like on the basis of designed dimensions of a liquid supply port.

Figure 3F:
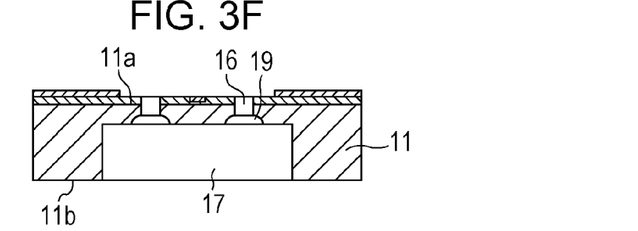

Next, as illustrated in FIG. 3F, the etching stop layer 24, which is a tape and which has been formed on the side on which the first surface 11a of the substrate 11 is present, is peeled off from the first surface 11a of the substrate 11, and after that, the etching masks 23 and 25 are respectively peeled off from the first surface 11a and the second surface 11b of the substrate 11. Examples of a method for peeling off the tape, which is used as the etching stop layer 24, include a method of peeling off the tape by UV irradiation, a method of peeling off the tape by heating. In the present embodiment, an object to be peeled off is peeled off while being heated at 50° C. Since each of the etching masks 23 and 25 is formed of a positive-type resist, the etching masks 23 and 25 are peeled off by using a common resist peeling solution (1112A; trade name, manufactured by Rohm and Haas Electronic Material). The substrate 11 for the liquid discharge head 10 is formed by the above-described method.

Figure 3G:
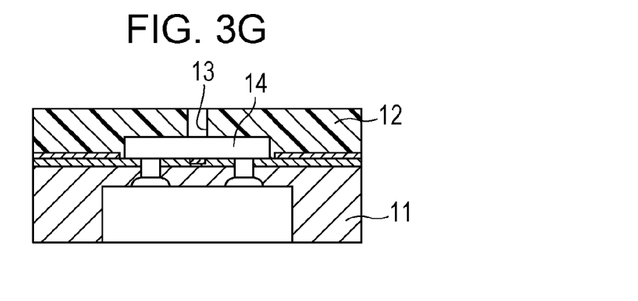

After that, as illustrated in FIG. 3G, an orifice plate 12 in which discharge ports 13 and flow paths 14 are formed is disposed on the first surface 11a of the substrate 11, and as a result, the liquid discharge head 10 is obtained.

As a method for forming the orifice plate 12 on the substrate 11 in which the first holes 16 and the second hole 17 are in communication with one another, after the orifice plate 12, which is made of a photosensitive resin, has been formed on a support, the orifice plate 12 is separated from the support, and the orifice plate 12 is joined to the first surface 11a of the substrate 11. This process is not illustrated in the drawings.

Although examples of the support include a film, a glass, and a silicon wafer, considering the fact that the orifice plate 12 will be peeled off later, it is desirable that a film be used as the support. Examples of such a film include a polyethylene terephthalate (hereinafter referred to as PET) film, a polyimide film, a polyamide film, and the like. In addition, in order to facilitate the separation of the substrate, a release treatment may be performed.

As a method for forming the orifice plate 12, a first photosensitive resin is patterned on the support as the patterns of the flow paths 14, and after that, a second photosensitive resin is formed into a film in such a manner as to cover the first photosensitive resin. Then, holes that serve as the discharge ports 13 are formed in the second photosensitive resin in such a manner as to reach the first photosensitive resin. Then, the first photosensitive resin is removed by an organic solvent via the holes, so that the flow paths 14 are formed.

As a method for forming the first photosensitive resin, a spin coating method is used. Other examples of the method include a slit coating method and the like for applying the first photosensitive resin on the support and a laminating method, a pressing method, and the like for transferring the first photosensitive resin onto the support. The first photosensitive resin is formed in such a manner as to have a thickness of 20 μm, and an epoxy resin that can be dissolved by the organic solvent is used as the material of the first photosensitive resin. Alternatively, a resin such as an acrylic resin or a urethane resin may be used.

Second Embodiment

Figure 4A:
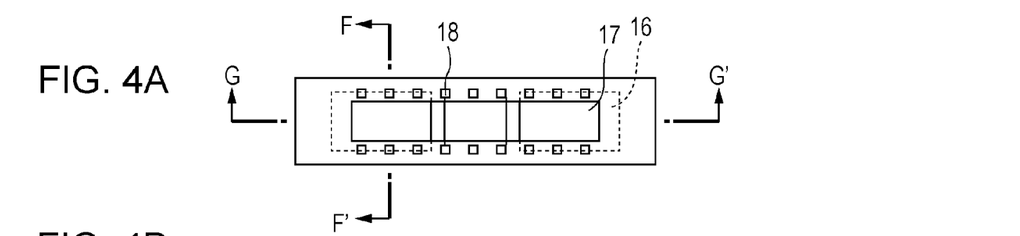
FIGS. 4A to 4E are schematic process diagrams illustrating a second embodiment.

A method of manufacturing a liquid discharge head according to a second embodiment of the present invention will now be described. FIG. 4A is a plan view illustrating a substrate for the liquid discharge head. FIGS. 4B to 4E are sectional views [i] taken along line F-F' of FIG. 4A and sectional views [ii] taken along line G-G' of FIG. 4A and illustrate a process of manufacturing the substrate for the liquid discharge head of the second embodiment on a time-series basis.

Figure 4B:
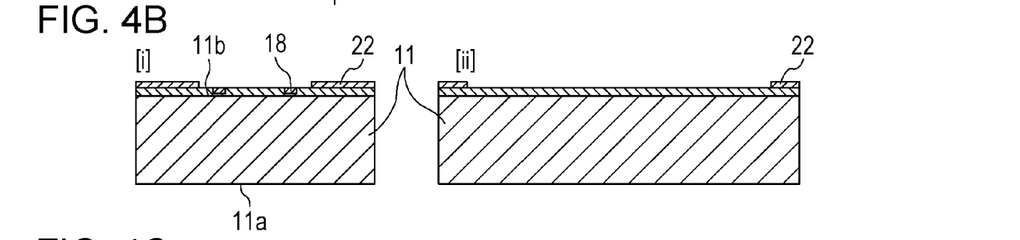
Figure 4C:
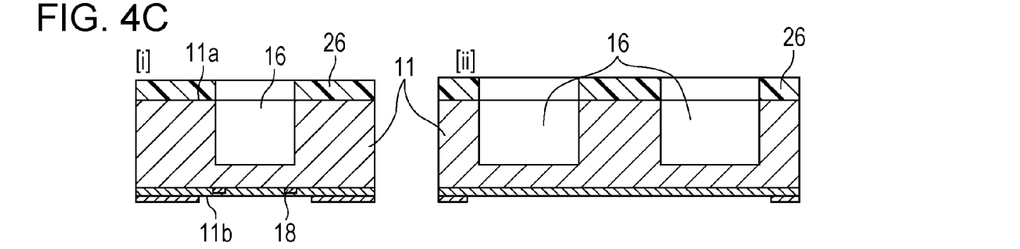
Figure 4D:
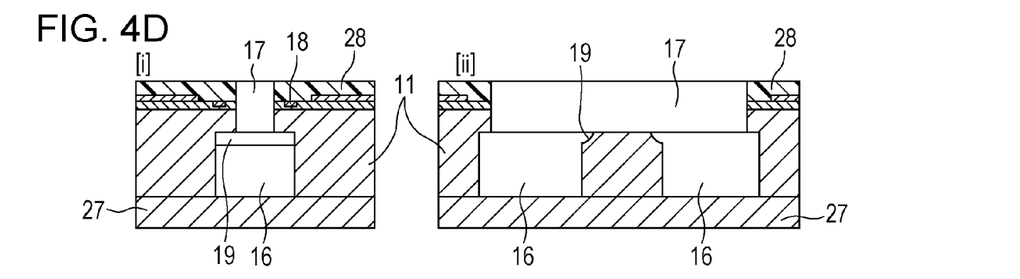

The differences from the method in the first embodiment are that one of the surfaces of the substrate 11 on which the heaters 18 are not disposed is the first surface 11a, and the other one of the surfaces of the substrate 11 on which the heaters 18 are disposed is the second surface 11b, and that an etching operation for forming the first holes 16 is performed first on the first surface 11a (FIG. 4C), and after that, an etching operation for forming the second hole 17 is performed on the second surface 11b (FIG. 4D). In other words, the first surface 11a and the second surface 11b of the substrate 11 respectively correspond to the second surface 11b and the first surface 11a of the substrate 11 of the first embodiment (FIGS. 3A to 3G).

In the above-described first embodiment, after the second hole 17 has been made to communicate with the first holes 16, the etching operation for forming the second hole 17 is performed for some period of time (see FIG. 3E). In this case, a considerable amount of the gas that etches the second hole 17 enters the first holes 16, and the precision with which the first holes 16 are formed deteriorates, so that it is very likely that the precision with which the second hole 17 is formed will be higher than the precision with which the first holes 16 are formed.

In contrast, in the second embodiment, since the first holes 16 are formed in the first surface 11a of the substrate 11, on which the heaters 18 are not disposed, and after that, an etching operation for forming the second hole 17 is performed on the second substrate 11b, on the opposite side to the first surface 11a, the second embodiment has an advantage that the dimensional accuracy of the opening of the second hole 17 that is continuous with the second substrate 11b, on which the heaters 18 are disposed, increases. Since the shapes of holes that directly communicate with the flow paths 14 of the orifice plate 12 affect flow resistance and liquid discharging performance, and thus, an improvement in the dimensional accuracy of the opening of the second hole 17 becomes a great advantage.

Figure 4E:
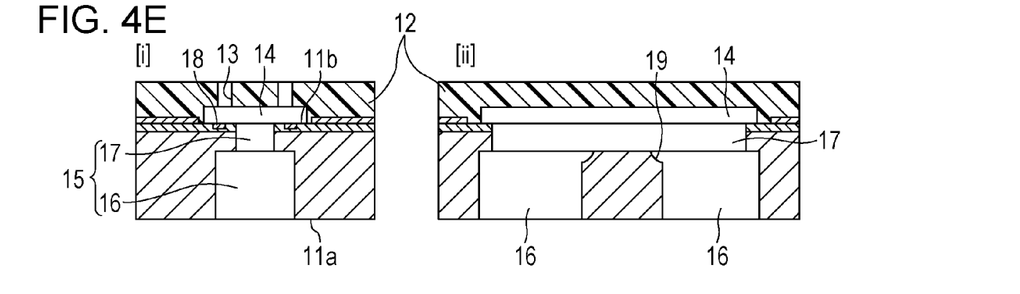

Note that, in the liquid discharge head of the second embodiment, as illustrated in FIGS. 4A and 4E, the second hole 17 having a substantially rectangular opening is formed in the second surface 11b of the substrate 11 having a substantially rectangular shape. The plurality of heaters 18 are arranged in the longitudinal direction of the substrate 11 in the vicinity of an opening edge of the second hole 17 in the second surface 11b. Two of the first holes 16 are formed in the first surface 11a of the substrate 11 in such a manner as to be in communication with end portions of the second hole 17 in the longitudinal direction of the substrate 11. The second hole 17 and the two first holes 16 form the liquid supply port 15. The orifice plate 12 is joined to the second surface 11b. In the orifice plate 12, the plurality of flow paths 14, which are in communication with the second hole 17 and in which the heaters 18 are arranged, and the discharge ports 13, which are in communication with the flow paths 14 and positioned above the heaters 18, are formed.

In the shape of the liquid supply port 15 illustrated in FIG. 4E, the crown 21 is formed in both cases where an etching operation for forming a hole in the first surface 11a of the substrate 11 is performed first and where an etching operation for forming a hole in the second surface 11b of the substrate 11 is performed first. This is because, in the shape of the liquid supply port 15 illustrated in FIG. 4E, a portion of an opening end of one of two holes 16 and 17, which are continuous with each other, is present within the other one of the holes 16 and 17 when the substrate 11 is viewed in plan in both cases where the hole 16 is formed first and where the hole 17 is formed first.

Although in the second embodiment, the case where the above-described advantage can be obtained, that is, the case where an etching operation is performed first on the first surface 11a of the substrate 11, on which the heaters 18 are not disposed, is described, the second hole 17 illustrated in FIG. 4E may be formed first, and after that the first holes 16 may be formed.

A method of manufacturing a liquid discharge head according the second embodiment will be specifically described below.

First, as illustrated in FIG. 4B, the substrate 11 for a liquid discharge head 10, the substrate 11 including the heaters 18, each of which includes a liquid-discharge-energy-generating element, and wiring lines (not illustrated), which are used for driving the heaters 18, formed on the substrate 11, is prepared. The substrate 11 is a silicon single-crystal substrate made of an ingot having a crystal orientation of <100>. The heaters 18 and the wiring lines are formed on one surface (second surface 11b) of the silicon substrate, and after that, HIMAL (manufactured by Hitachi Chemical Company, Ltd.) that serves as the intermediate layer 22 is patterned through a photolithography process. The intermediate layer 22 is disposed between the substrate 11 and the orifice plate 12 in the liquid discharge head 10 in such a manner as to improve the degree of contact between the substrate 11 and the orifice plate 12.

Next, as illustrated in FIG. 4C, an etching mask 26 that is used for forming the first holes 16 is patterned on the side on which the first surface 11a of the substrate 11 is present, and the first holes 16 are formed. In this case, as illustrated in FIG. 4C [ii], the etching mask 26 is formed into a pattern in which the first holes 16 are arranged in two lines in the longitudinal direction of the substrate 11, which has a rectangular shape when seen in plan view. Similarly to the first embodiment, a novolac-based positive-type resist is used as the material of the etching mask 26.

After the etching mask 26 has been removed, as illustrated in FIG. 4D, a tape 27 that serves as an etching stop layer is formed by tenting on the first surface 11a in which the first holes 16 have been formed. Then, an etching mask 28 is formed on the side on which the second surface 11b, on which the heaters 18 have been formed, is present and the second hole 17 is formed. In this case, since portions of the opening ends of the first holes 16 are present within the second hole 17, in order to avoid a situation in which the portions serve as crowns, the opening-widened portions 19 are formed by practicing the present invention. As a method for forming the second hole 17, the non-Bosch process is performed. $SF_6$ gas and $O_2$ gas are used, and the pressure and the flow rate of each of the gases are respectively set to 10 Pa and 500 sccm. After the second hole 17 has been formed under the above etching conditions, the gas pressure is changed to 1 Pa without changing the rest of the etching conditions immediately before the second hole 17 is made to communicate with the first holes 16, and then, an etching operation is performed. As a result, the opening-widened portions 19 are formed. After that, the tape 27 and the etching mask 28 are removed from the substrate 11, and as illustrated in FIG. 4E, the orifice plate 12 is formed on the second surface 11b of the substrate 11, and the liquid discharge head 10 is obtained.

Third Embodiment

Figure 5A:
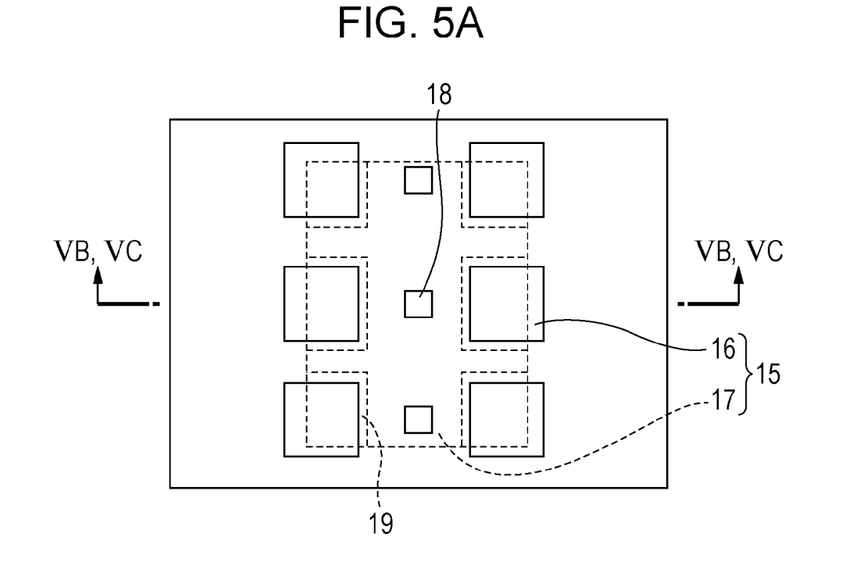
FIGS. 5A to 5C are schematic process diagrams illustrating a third embodiment.
Figure 5B:
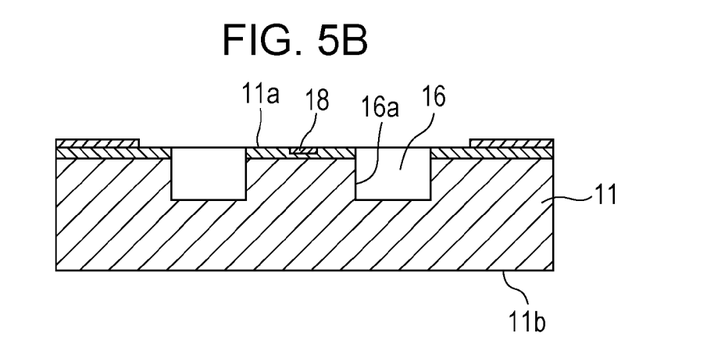
Figure 5C:
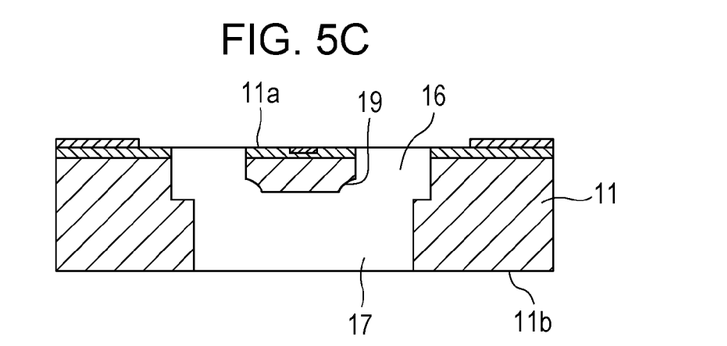

A method of manufacturing a liquid discharge head according to a third embodiment of the present invention will now be described. FIG. 5A is a plan view illustrating a substrate for the liquid discharge head. FIG. 5B is a sectional view taken along line VB-VB of FIG. 5A, and FIG. 5C is a sectional view taken along line VC-VC of FIG. 5A. FIGS. 5B and 5C illustrate a process of manufacturing the substrate for the liquid discharge head of the third embodiment on a time-series basis.

Similarly to the first embodiment, in the third embodiment, as illustrated in FIG. 5B, one of the surfaces of the substrate 11 on which the heaters 18 are disposed is the first surface 11a, an etching operation for forming the first holes 16 is performed first on the first surface 11a. However, the difference from the first embodiment and the second embodiment is that the liquid supply port 15 has a shape in which not the entirety but portions of the first holes 16 are in communication with the second hole 17.

Also in the shape of the liquid supply port 15 illustrated in FIG. 5A, as illustrated in FIG. 5C, the advantageous effects of the present invention can be obtained by scraping off edge portions of the side walls 16a of the first holes 16 that are continuous with the second hole 17 through an etching step for forming the second hole 17 in such a manner as to form the above-described communication portions (see the opening-widened portions 19) each of which is wider than the opening of the corresponding first hole 16 between the first holes 16 and the second hole 17.

After the first holes 16 have been formed, an etching operation for forming the second hole 17 is performed in such a manner that the opening-widened portions 19 are formed under conditions in which the gas type, the gas pressure, the gas flow rate, and the etching time are not changed from those in the conditions in the first embodiment under which the etching operation for forming the second hole 17 is performed and in which the length of time for performing the coating step is changed from 5 seconds to 2 seconds. Because of this, an etching operation can be performed after reducing the thicknesses of the protective films on the side walls 16a and 17a of the holes 16 and 17 in the above-described Bosch process, and as a result, the shapes (the opening-widened portions 19) of the openings of the first holes 16 that are widened are formed as described above.

Note that the technology of the present invention is also useful in the case where the second hole 17 illustrated in FIGS. 5A and 5C is formed first, and after that the first holes 16 are formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-099415, filed May 13, 2014, which is hereby incorporated by reference herein in its entirety.

What is claimed is:

1. A substrate processing method, comprising:
    forming a first hole from a first surface of a silicon substrate into a silicon part of the silicon substrate so that the first hole has a depth so that the first hole does not extend through the silicon substrate; and
    forming a second hole from a second surface, which opposes the first surface, into the silicon part of the silicon substrate by performing dry etching so as to reach the first hole and communicate with the first hole, so that a through hole, which is formed of the first hole and the second hole, is formed in the silicon substrate,
    wherein the through hole has a shape such that at least a portion of an opening end of the first hole is present within the second hole when the second surface is viewed in plan, and
    wherein the forming of the second hole includes forming a communication portion, which is wider than an opening at the first surface of the first hole, after the second hole has been made to communicate with the first hole by the dry etching, wherein the communication portion replaces a portion of the first hole that is located at a depth range adjacent to the bottom of the first hole where the second hole has been made to communicate with the first hole, and the communication portion is formed by widening said portion of the first hole,
    wherein, after the second hole is made to communicate with the first hole, original etching conditions for forming the second hole are changed to new etching conditions, so that an edge portion of a side wall of the first hole, which is continuous with the second hole, is removed by etching using the new etching conditions, to form the communication portion.

2. The substrate processing method according to claim 1, wherein, in the forming the second hole, a method in which an etching step of forming a hole and a coating step of forming a protective film on a side wall of the hole formed through the etching step are alternately repeated is used,
    wherein the communication portion is formed between the first hole and the second hole by sequentially performing the coating step and the etching step after the second hole has been made to communicate with the first hole, and
    wherein etching conditions in the etching step performed after the second hole has been made to communicate with the first hole are changed, by altering at least one of a gas pressure, a gas flow rate, a coil power and a platen power, from conditions under which removal of a protective film that is formed on a side wall of the first hole through the coating step is not enabled, to conditions under which removal of the protective film is enabled.

3. The substrate processing method according to claim 1,
wherein, in the forming the second hole, a method in which an etching operation for forming a hole and formation of a protective film on a side wall of the hole formed by the etching operation are performed simultaneously is used, and
wherein, when the second hole is made to communicate with the first hole, etching conditions are changed from original etching conditions to conditions under which a degree of etching in a direction toward a side wall of the second hole increases.

4. The substrate processing method according to claim 2,
wherein, the etching conditions in the etching step performed after the second hole has been made to communicate with the first hole include an etching time that is 10% longer than an etching time under original etching conditions and application of the platen power that is set within a range of 50 W to 200 W during the etching time.

5. The substrate processing method according to claim 3,
wherein the etching conditions, which have been changed, include the gas pressure of 5 Pa or less.

6. A method of manufacturing a substrate for a liquid discharge head including formation of a liquid supply port that serves as a through hole in a silicon substrate, the method comprising:
forming a first hole from a first surface of the silicon substrate into a silicon part of the silicon substate so that the first hole has a depth so that the first hole does not extend through the silicon substrate; and
forming a second hole from a second surface, which opposes the first surface, into the silicon part of the silicon substrate by performing dry etching so as to reach the first hole and communicate with the first hole, so that the through hole, which is formed of the first hole and the second hole, is formed in the silicon substrate,
wherein the through hole has a shape such that at least a portion of an opening end of the first hole is present within the second hole when the second surface is viewed in plan, and
wherein the forming the second hole includes forming a communication portion, which is wider than an opening at the first surface of the first hole, after the second hole has been made to communicate with the first hole by the dry etching, wherein the communication portion replaces a portion of the first hole that is located at a depth range adjacent to the bottom of the first hole where the second hole has been made to communicate with the first hole, and the communication portion is formed by widening said portion of the first hole,
wherein, after the second hole is made to communicate with the first hole, original etching conditions for forming the second hole are changed to new etching conditions, so that an edge portion of a side wall of the first hole, which is continuous with the second hole, is removed by etching using the new etching conditions, to form the communication portion.

7. The method of manufacturing a substrate for a liquid discharge head according to claim 6,
wherein, in the forming the second hole, a method in which an etching step of forming a hole and a coating step of forming a protective film on a side wall of the hole formed through the etching step are alternately repeated is used,
wherein the communication portion is formed between the first hole and the second hole by sequentially performing the coating step and the etching step after the second hole has been made to communicate with the first hole, and
wherein etching conditions in the etching step performed after the second hole has been made to communicate with the first hole are changed, by altering at least one of a gas pressure, a gas flow rate, a coil power and a platen power, from conditions under which removal of a protective film that is formed on a side wall of the first hole through the coating step is not enabled, to conditions under which removal of the protective film is enabled.

8. The method of manufacturing a substrate for a liquid discharge head according to claim 6,
wherein, in the forming the second hole, a method in which an etching operation for forming a hole and formation of a protective film on a side wall of the hole formed by the etching operation are performed simultaneously is used, and
wherein, when the second hole is made to communicate with the first hole, etching conditions are changed from original etching conditions to conditions under which a degree of etching in a direction toward a side wall of the second hole increases.

9. The method of manufacturing a substrate for a liquid discharge head according to claim 7,
wherein, the etching conditions in the etching step performed after the second hole has been made to communicate with the first hole include an etching time that is 10% longer than an etching time under original etching conditions and application of the platen power that is set within a range of 50 W to 200 W during the etching time.

10. The method of manufacturing a substrate for a liquid discharge head according to claim 8,
wherein the etching conditions, which have been changed, include the gas pressure of 5 Pa or less.

* * * * *